United States Patent [19]

Suzuki et al.

[11] Patent Number: 4,658,376
[45] Date of Patent: Apr. 14, 1987

[54] MAGNETIC BUBBLE FILE SYSTEM

[75] Inventors: Kunio Suzuki; Kunihiko Onuma; Koji Masui, all of Hitachi, Japan

[73] Assignee: Hitachi, Ltd., Tokyo, Japan

[21] Appl. No.: 664,845

[22] Filed: Oct. 25, 1984

[30] Foreign Application Priority Data

Nov. 30, 1983 [JP]  Japan ................................ 58-224241

[51] Int. Cl.$^4$ ............................................. G11C 19/08
[52] U.S. Cl. ................................................. 365/1
[58] Field of Search ................................... 365/1

[56] References Cited

U.S. PATENT DOCUMENTS 4,393,500  7/1983  Imazeki et al. ......................... 365/1

FOREIGN PATENT DOCUMENTS 0065390  3/1981  Japan .................................... 365/1

OTHER PUBLICATIONS

Electronics Design-vol. 27, No. 15, Jul. 19, 1979, pp. 32-33.

Primary Examiner—James W. Moffitt
Attorney, Agent, or Firm—Antonelli, Terry & Wands

[57] ABSTRACT

A magnetic bubble file system having a magnetic buffle memory includes magnetic bubble memory devices as memory media for constructing a plurality of pages of information store areas read and written by page. The store area of a selected one of the plurality of pages of the magnetic bubble memory devices is allotted to a write protection information store page for the magnetic bubble memory. The write protection information store page stores write protection information of each page of data store pages of the magnetic bubble memory. The magnetic bubble file system determines whether data can be written in to the data store page, in accordance with the write protection information stored in the write protection information store page.

3 Claims, 5 Drawing Figures

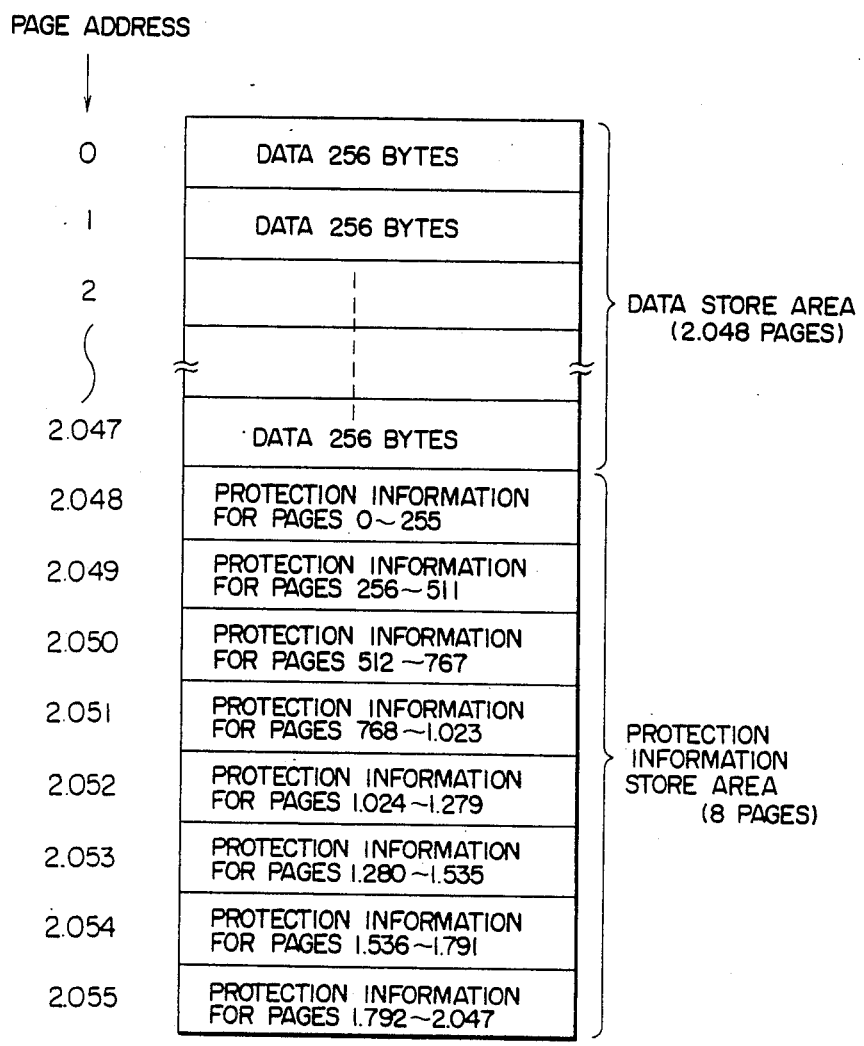

MAGNETIC BUBBLE FILE SYSTEM

BACKGROUND OF THE INVENTION

1. Field of the Invention

The present invention relates to a magnetic bubble file system, and more particularly to a magnetic bubble file system having a write protection function.

2. Description of the Prior Art

In a storage device such as a magnetic disk, each record unit is divided into an Identification (ID) field and a data field, and when the record unit is to be read or written, the ID field may be read or written before the data field is read or written, because, in the storage device such as the magnetic disk, a read/write unit, that is, a bit length can be more or less flexibly determined. Thus, in the magnetic disk, a write protection information may be stored in the ID field of each record unit so that write enable or write disable status can be determined in accordance with the information in the ID field.

On the other hand, in a magnetic bubble memory, a record unit is a page and a whole page must be read or written because of the complexity of control for magnetic bubble memory devices. It is very difficult to switch the read and write operations in one access to one page. Accordingly, it is not possible to store write protect information with the data in each page and read out the write protect information when the page is to be accessed in order to determine whether information can be written or not. Accordingly, the write protection function for each record unit is not attained, as opposed to the magnetic disk.

Japanese Patent Application Laid-Open Publication No. 65390/81 discloses a magnetic bubble memory control system for controlling a bubble memory in which read control information is updated based on a specific condition of information read from the magnetic bubble memory so that a file storage device is provided with a simple configuration. However, it does not teach the write protection.

An article "method for operating Hitachi IM-bit magnetic memory board" Hitachi Electronic Components Technical Data, July 1, 1982 discloses a system in which defect loop information is stored in a magnetic bubble memory and it is read out at a first access to the bubble and stored in a RAM, and in subsequent accesses, the stored information is referenced so that read and write operations are carried out for valid loops. However, it does not teach the write protection function for each page.

SUMMARY OF THE INVENTION

It is an object of the present invention to provide a magnetic bubble file system having a write protection function for each page of the magnetic bubble memory so that the magnetic bubble file system can be used as a storage device in a broad field.

In accordance with the present invention, the magnetic bubble file system has a magnetic bubble memory having magnetic bubble memory devices which form a plurality of storage areas for storing a plurality of pages of information. Certain pages of the plurality of pages are allocated to write protection information, in which write protection information of all other data storage pages are stored, and when data is to be written in to one of the data storage pages, whether it is allowed to write or not is determined in accordance with the write protection information.

In accordance with the present invention, the write protection function can be readily provided to the magnetic bubble memory so that the magnetic bubble memory can be used in a broad field as a usual data file that is, a magnetic bubble file, in the same manner as a magnetic disk or a magnetic drum is used.

In accordance with one embodiment on the present invention, the content of the write protection information storage page in the magnetic bubble memory is stored in a write protection information register, and when data is to be written in to one of the data storage pages, whether it is allowed to write or not is determined in accordance with the content of the write protection store register. In this embodiment, the reading or writing of the magnetic bubble memory can be effected page by page, and whether it is allowed to write or not can be immediately determined since the write protection information is stored in the register. Accordingly, the throughput of the computer is not affected.

BRIEF DESCRIPTION OF THE DRAWINGS

These and other objects and advantages of the present invention will become apparent from the following description and the accompanying drawings wherein:

FIG. 2 shows an example of a bubble memory map in the embodiment of FIG. 1.

DESCRIPTION OF THE PREFERRED EMBODIMENTS

Figure 1A:
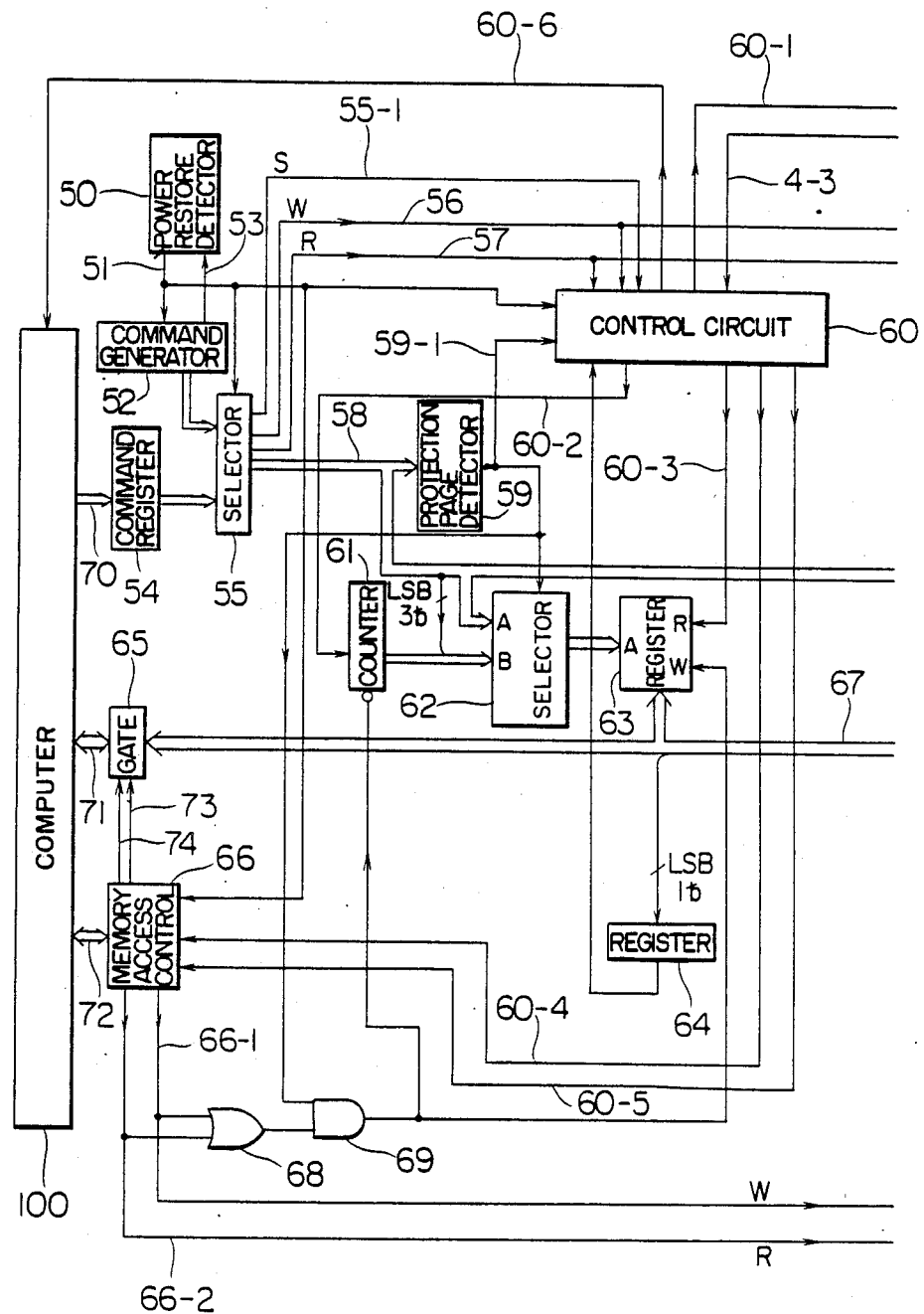
FIGS. 1a and 1b are block diagrams of one embodiment of a magnetic bubble file system of the present invention.
Figure 1B:
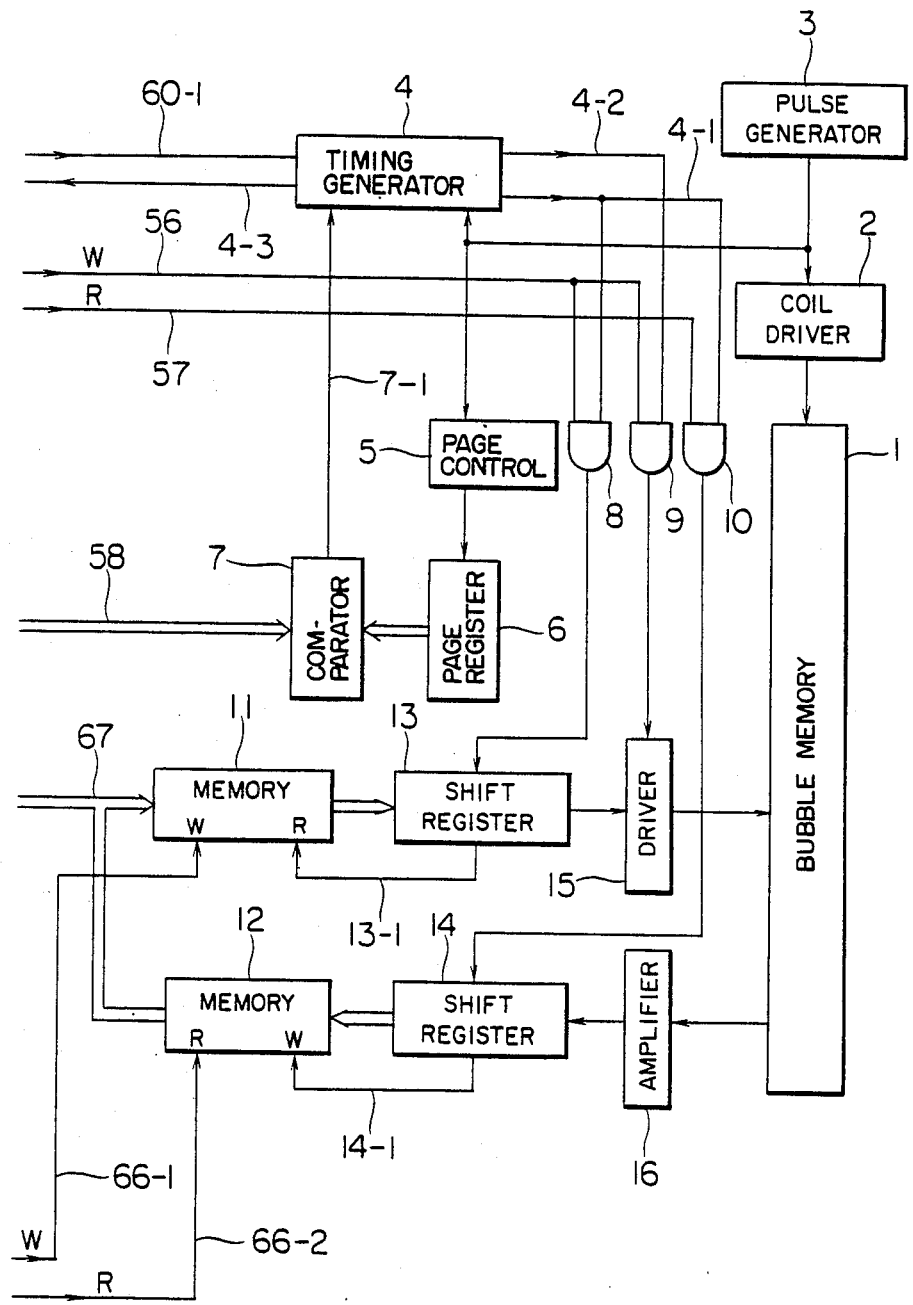

FIGS. 1a and 1b show a configuration of one embodiment of a magnetic bubble file system of the present invention. In the present embodiment, a bubble memory (designated by 1 in FIG. 1) has 2056 pages in total and 2048 bit or 256 bytes per page. Of the 2056 pages, 2048 pages are used to store data, and 8 pages are used to store write protection information. The write protection information per page is one byte and total write protection information is one byte×2048 (number of pages)=2048 bytes which correspond to eight pages. This is illustrated in FIG. 2. Only the least significant bit in one byte is used as the protection information. When it is "1", this shows that the writing is inhibited, and when it is "0", this shows that the writing is allowed.

The operation will be explained with reference to FIG. 1.

(1) Power up operation

When the power of the magnetic bubble file system is turned on after it was turned off, the storage content of the magnetic bubble memory remains undestroyed because the memory is non-volatile but the information stored in a register in a controller for the memory is destroyed because the register is an IC memory. Accordingly, in a power up operation, the write protection information is read from the magnetic bubble memory and set in the information store register.

Figure 3:
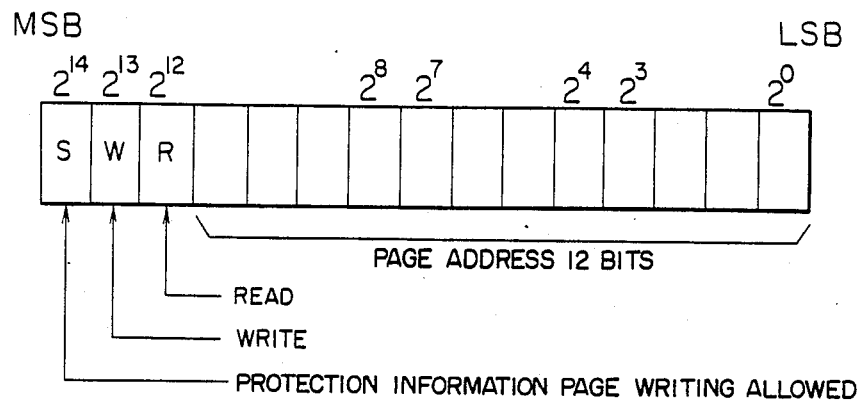
FIG. 3 shows an instruction code format in the embodiment of FIG. 1.

A power restore detector 50 produces a power restore signal 51 when the power is restored. In response to this signal, a power restore process instruction generator 52 issues read instructions sequentially to read the pages 2048 to 2055, that is, the protection information store pages. The read instruction sequence is for eight pages, and after the eight pages have been read, the output signal 51 of the power restore detector 50 is reset by an end signal 53 to terminate the power restoring process. One page of operation for the protection information store page is as follows. The power restore process instruction generater 52 issues a 15-bit instruction which is identical to a bit pattern of an instruction from a host computer 100. An example of an instruction format is shown in FIG. 3. The most significant bit S represents a privilege, the next bit W represents writing to the bubble memory, the next bit R represents the reading from the bubble memory, and the low order 12 bits represent a page of the bubble memory. Since the data store pages range from page 0 to page 2047, they can be identified by 11 bits, and the most significant bit of the page identification bits represents the write protection information store page. The power restore process instruction generator 52 generates a pattern in which the R-bit is "1" and the most significant bit of the page identification bits is "1". This pattern is gated through a selector 55 by the signal 51 applied thereto. As a result, a control circuit 60 receives a read signal 57 from the selector 55 and supplies a start signal 60-1 to a timing generator 4.

A pulse generator 3 generates a basic clock signal necessary to shift a bubble loop in the bubble memory 1 and supplies it to a page control circuit 5, a coil driver 2 and the timing generator 4. A page register 6 stores the page number of the bubble memory currently being accessed. A page information 58 in the pattern signal from the generator 52 supplied from the selector 55 is compared with the page register 6 by a comparator 7, and when they are equal, a compare-equal signal 7-1 is produced so that the timing generator 4 starts to generate a timing signal 4-1. The bit-serial data in the bubble memory 1 is always read out by a sense amplifier 16, and an output therefrom is supplied to a shift register 14 by the timing signal 4-1 passed through an AND gate 10. The shift register 14 stores the data in a memory 12 by write signal 14-1 each time the eight-bit data is completed. At the end of one page of reading, the timing generator 4 terminates the timing signal 4-1 and generates an end signal 4-3. In this manner, one page of data, that is, the information on the page indicated by the pattern signal from the power restore process instruction generator 52 is stored in the memory 12 and the control circuit 60 detects the end of operation.

Figure 4:
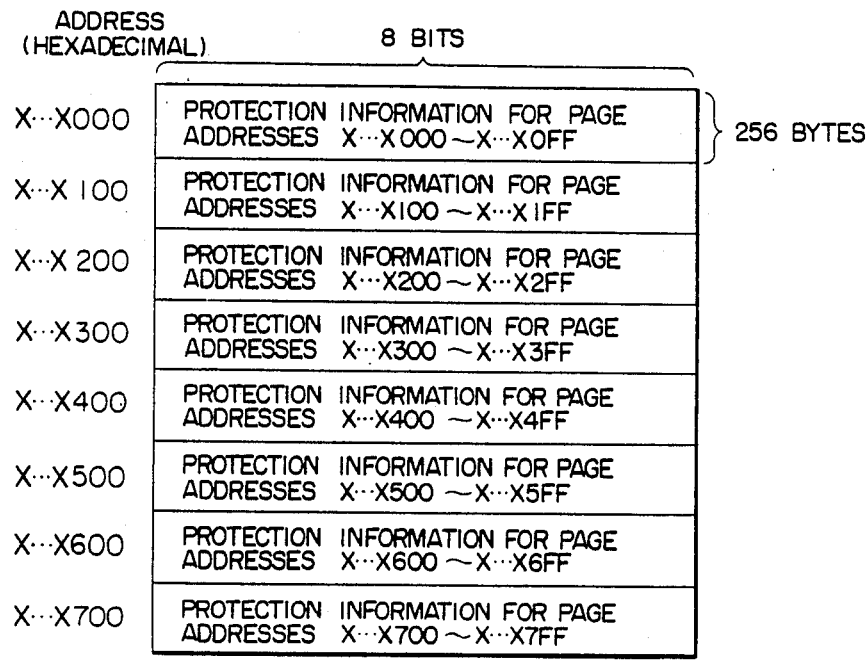
FIG. 4 shows an example of a memory map of a protection information store memory in the embodiment of FIG. 1.

Since the control circuit 60 received the power restore signal 51, it determines that the operation carried out is the power restore process, and carries out the following additional operation. A counter 61 is reset by a signal 60-2. The page information 58 at the output of the selector 55 has a 12-bit page address, and a protection page detector 59 checks if the most significant bit is "1" or not, and if it is "1", it produces a signal 59-1. The signal 59-1 selects a B input of a selector 62, and an output therefrom is connected to an address input of a write protection information store register 63. The B input of the selector 62 contains the output of the counter 61 in low order eight bits and low order three bits of a bus 58 in the high order three bits. The register 63 has an 8 bits ×2048 words configuration and stores the content of the write protection information store pages (eight pages in total) of the bubble memory 1. A memory map thereof is shown in FIG. 4. This register may also referred to as a memory. The output of the selector 62 points to a head of the register 63 corresponding to the protection information page pointed to by the page information 58.

The control circuit 60 issues a read instruction signal 60-4 to a memory access control circuit 66, which transfers data between the memory 11 or 12 and a host computer 100 through a bus 67. When the power restore signal 51 is applied to the access control unit 61, it suppresses the data transfer with the host computer 100 and accesses the memory 11 or 12. When it receives the read instruction signal 60-4, it produces a read signal 66-2 of 256 bytes for one page. The signal 66-2 is used to read the data from the memory 12, and it also passes through an OR gate 68 and through an AND gate 69 to which the signal 59-1 is applied and is applied to a write signal input of the memory 63. The output signal of the gate 69 updates the counter 61 by a trailing edge thereof, and the updated content of the counter 61 and the high order three bits of the page information 58 are supplied to the register 63 through the selector 62, as an updated address. In this manner, the data in the memory 12, that is, the 256-byte data on the page 2048 (first page of the eight protection information pages) of the bubble memory is stored in the corresponding area in the register 63, at the addresses 0-255 in the present embodiment.

Since the power restore process instruction generator 52 generates the instruction sequence for all protection information pages as described above, the data of all protection information pages in the bubble memory 1 are stored in the register 63 at the end of the power restore process.

(2) Readout from the computer 100

The bubble memory data in the computer 100 is read out in the following manner.

A read command is set in a command register 54 through a bus 70. This format is shown in FIG. 3. The S bit and the W bit are "0", the R bit is "1", and the page address of the page to be read is stored in the page address field. The output of the register 54 passes through the selector 55 because the power restore signal 53 in not applied to the selector 55. The subsequent operation is the same as that in the power restore process (1). Since the power restore signal 51 is not applied this time to the memory access circuit 66, the memory access circuit 66 controls the reading of the data from the memory 12 by a gate control signal 73 transfers the data on the bus 67 to the bus 71 through the gate 65, and inputs the data to the computer 100 through a control bus 72.

In this manner, the data in the designated page of the bubble memory is read out and supplied to the computer 100 by the instruction from the computer 100. (3) Writing from the computer 100

The writing of the data into the bubble memory 1 is started by setting a write command in the register 54 from the computer 100, like the reading described in (2) above. A commmand format is shown in FIG. 3. The W bit is "1", the R bit is "0" and the page address of the page in the bubble memory 1 to be written is stored in the page address field. The output of the register 54 passes through the selector 55, and a write signal 56 is applied to the control circuit 60. The control circuit 60 checks the signal 59-1 before it starts the write operation in order to determine whether the command is for a data page or for a protection information page.

If the command is for the data page, it is checked whether it is allowed to write in the page or not, whether writing is allowed or not being determined in the following manner. When the data page is designated, the signal 59-1 is not produced and the selector 62 selects the input A and the low order 11 bits of the content on the bus 58 are supplied to the register 63 as a read address. Thus, the address at which the protect information corresponding to the page designated by the high order bits is supplied to the register 63. The control circuit 60 reads out the data at that address of the register 63 by the read signal 60-3. Since the register 64 is connected to store the least significant bit of the bus 67, the protection information for the designated page in the register 63 is held in the register 64, and the output is supplied to the control circuit 60. The control circuit 60 checks the signal to determine whether it is allowed to write in the designated page or not. If the writing is inhibited, the control circuit 60 immediately produces a protect error signal 60-6 to indicate the error to the computer 100. If the writing is allowed, the data is written into the bubble memory 1 in the following sequence.

The control circuit 60 produces a write command signal 60-5 and the memory access control circuit 66 responds to the write command signal 60-5 to produce a gate control signal 74 so that the gate 65 is opened in the direction to transfer the data 71 from the computer 100 to the bus 67. Thus, the data is transferred through the control bus 72. The data is transferred for one page or 256 bytes, and the write signal 66-1 is produced 256 times, once for each one byte transfer. The data from the computer 100 are stored in the memory 11.

The control circuit 60 then produces a start signal 60-1. The timing generator 4 generates a timing signal 4-1 for timing the bits from the time point of receiving the start signal 60-1 and the output signal 7-1 of the comparator 7, and a timing signal 4-2 for driving a write driver 15. A shift register 13 reads out new data from the memory 11 and stores it by a signal 13-1 when the 8-bit shift register of its own is empty, and shifts the data to the write driver 15, serially by bit, by a timing signal supplied from the AND gate 8. The write driver 15 generates a write signal by the output signal from the AND gate 9 to write the input data. In this manner, the data from the computer 100 is written on the designated page of the bubble memory 1.

After the timing generator 4 has generated the timing signals 4-1 and 4-2 for one page, it generates an end signal 4-3 to terminate the timing signal. Thus, the control circuit 60 terminates the one page of data writing.

If the write command from the computer 100 is for the protect information page, the control circuit 60 detects it by a signal 59-1 from the protection page detector 59 and checks a signal 55-1 of the instruction bit S. Since the protect information store page has no protection information, the security of the system is maintained by adding the privilege bit to the instruction from the host computer. When the data is written into the protection information store page, the signal 55-1 permits writing. If the signal is not present, the control circuit 60 produces the protection error signal 60-6 and terminates the operation. The writing into the protection information store page is effected after the control circuit 60 resets the counter 61 by the signal 60-2. The selector 62 outputs the address of the register 63 at which the content of the page of the bubble memory to which the data is written is stored, and the signal 59-1 opens the gate 69 so that the data transferred from the computer 100 to the memory 11, that is, the data written on the protection information store page is also stored in the corresponding area in the register 63.

While particular embodiments of the invention have been shown and described, it will be obvious to those skilled in the art that various changes and modifications may be made without departing from the present invention in its broader aspect.

What is claimed is:

1. A magnetic bubble file system comprising:
   a magnetic bubble memory including a plurality of magnetic bubble memory devices for storing a plurality of pages of information to be read and written by page in respective store areas, the store areas of selected ones of said plurality of pages of said magnetic bubble memory devices being allotted to the storing of write protection information for data stored in the other store areas of said magnetic bubble memory; and
   control means responsive to a write request signal for determining whether data can be written into a designated store area, in accordance with the write protection information stored in said selected ones of said store areas, and for generating a write control signal in accordance with that determination.

2. A magnetic bubble file system according to claim 1, wherein said control means includes a write protection information store register for storing the write protection information stored in said selected ones of said store areas, and means for determining whether writing data to a store area is allowed or inhibited in accordance with the content of said write protection information store register.

3. A magnetic bubble file system according to claim 2, further including means for generating a read command when a power is restored after power has been off, and means responsive to saiod read command for reading out said write protection information from said selected ones of said store areas and for writing said write protection information into said write protection information store register.

* * * * *